US011280827B2

(12) United States Patent
Thompson et al.

(10) Patent No.: US 11,280,827 B2
(45) Date of Patent: Mar. 22, 2022

(54) THERMAL CONTROL OF A PROBE CARD ASSEMBLY (71) Applicant: Teradyne, Inc., North Reading, MA (US)

(72) Inventors: Kevin A. Thompson, Thousand Oaks, CA (US); Isaac N Silva, Billerica, MA (US)

(73) Assignee: TERADYNE, INC., North Reading, MA (US)

( * ) Notice: Subject to any disclaimer, the term of this patent is extended or adjusted under 35 U.S.C. 154(b) by 0 days.

(21) Appl. No.: 15/056,789

(22) Filed: Feb. 29, 2016

(65) Prior Publication Data
US 2017/0248632 A1    Aug. 31, 2017

(51) Int. Cl.
G01R 31/28    (2006.01)
(52) U.S. Cl.
CPC ..... *G01R 31/2875* (2013.01); *G01R 31/2891* (2013.01)
(58) Field of Classification Search
CPC ............ G01R 31/2891; G01R 31/2874; G01R 31/2872; G01R 31/2875; G01R 31/2877; G01R 1/44; G01R 1/0458
See application file for complete search history.

(56) References Cited

U.S. PATENT DOCUMENTS

| 6,549,026 | B1* | 4/2003 | DiBattista | G01R 31/2891 324/750.09 |
| 2003/0085724 | A1* | 5/2003 | Mathieu | G01R 1/07342 324/750.03 |
| 2003/0217558 | A1* | 11/2003 | Wall | G01R 31/2874 62/223 |
| 2005/0280428 | A1* | 12/2005 | Ishikawa | G01R 1/06722 324/750.16 |
| 2006/0255814 | A1* | 11/2006 | Eldridge | G01R 31/2863 324/750.03 |
| 2007/0046307 | A1* | 3/2007 | Itakura | G01R 31/2865 324/750.03 |
| 2007/0082313 | A1* | 4/2007 | Itakura | G01R 31/2863 432/227 |

(Continued)

FOREIGN PATENT DOCUMENTS

| CN | 1582395 A | 2/2007 |
| CN | 101512354 A | 8/2009 |

(Continued)

OTHER PUBLICATIONS

International Search Report for PCT/US2017/013729, 3 pages (dated Apr. 20, 2017).

(Continued)

*Primary Examiner* — Huy Q Phan
*Assistant Examiner* — Dustin R Dickinson
(74) *Attorney, Agent, or Firm* — Burns & Levinson LLP (57) ABSTRACT An example test system includes a test head and a probe card assembly connected to the test head. The probe card assembly includes: a probe card having electrical contacts, a stiffener connected to the probe card to impart rigidity to the probe card, and a heater to heat to at least part of the probe card assembly. A prober is configured to move a device under test (DUT) into contact with the electrical contacts of the probe card assembly.

19 Claims, 4 Drawing Sheets

(56) References Cited

U.S. PATENT DOCUMENTS

| | | | |
|---|---|---|---|
| 2007/0268029 A1* | 11/2007 | McClanahan | G01R 1/44 324/750.09 |
| 2008/0116925 A1 | 5/2008 | Sunohara et al. | |
| 2008/0157791 A1* | 7/2008 | Hobbs | G01R 1/07378 324/756.03 |
| 2009/0206860 A1* | 8/2009 | McFarland | G01R 1/44 324/750.03 |
| 2010/0134129 A1* | 6/2010 | Breinlinger | G01R 31/2874 324/756.03 |
| 2010/0164525 A1* | 7/2010 | Han | G01R 1/0458 324/756.02 |
| 2010/0213960 A1* | 8/2010 | Mok | G01R 31/2889 324/762.03 |
| 2010/0264949 A1* | 10/2010 | Hobbs | G01R 31/2889 324/750.05 |
| 2010/0289514 A1 | 11/2010 | Washio et al. | |
| 2011/0248735 A1* | 10/2011 | Losey | G01R 31/2889 324/754.11 |
| 2012/0098118 A1* | 4/2012 | Lin | H01L 23/4006 257/713 |
| 2012/0146679 A1* | 6/2012 | Chang | G01R 1/07378 324/756.03 |
| 2013/0234745 A1* | 9/2013 | Yamada | G01R 1/44 324/750.11 |
| 2014/0354312 A1* | 12/2014 | Li | G01R 31/2891 324/750.03 |
| 2014/0368229 A1 | 12/2014 | Arai et al. | |
| 2017/0248632 A1 | 8/2017 | Thompson et al. | |

FOREIGN PATENT DOCUMENTS

| | | |
|---|---|---|
| CN | 104237578 A | 10/2017 |
| JP | 2004150999 A | 5/2004 |
| JP | 2010243352 A | 10/2010 |
| TW | 201237427 A | 9/2012 |
| WO | WO-2004/040321 A1 | 5/2004 |
| WO | 2006113708 A2 | 10/2006 |
| WO | 2006113708 A3 | 5/2009 |

OTHER PUBLICATIONS

Written Opinion for PCT/US2017/013729, 9 pages (dated Apr. 20, 2017).

International Preliminary Report on Patentability PCT/US2017/013729, 10 pages (dated Sep. 4, 2018).

First Office Action for Chinese Patent Application No. 201780010279. 3, (19 pages), dated Jun. 1, 2020. (the concise explanation of relevance for this document is in the accompanying transmittal).

Second Office Action for Chinese Patent Application No. 201780010279. 3. dated Feb. 1, 2021, with English Summary (21 Pages.).

Third Office Action for Chinese Patent Application No. 201780010279. 3. dated Jun. 11, 2021, with English Summary (20 Pages.).

Fourth Office Action for Chinese Patent Application No. 201780010279. 3. dated Oct. 12, 2021, with English Summary (18 Pages.).

Wang, S. et al. Theory and Application of Mechanical Thermal Deformation. National Defense Industry Press 60 pages, (2009).

* cited by examiner

THERMAL CONTROL OF A PROBE CARD ASSEMBLY

TECHNICAL FIELD

This specification relates generally to controlling the temperature of a probe card assembly in a test system.

BACKGROUND

A test cell may include a test head to route test signals to and from a device under test (DUT), such as a wafer. The test head includes an interface, called a probe card assembly, to make electrical and mechanical connection to the DUT. A prober moves the DUT into contact with the probe card assembly to perform testing.

Often, the DUT is at a higher temperature than the probe card assembly. As a result of this temperature difference, a probe card in the probe card assembly may deflect upon contact with the DUT, which can adversely affect connection to the DUT. Heretofore, the probe card assembly was subjected to an extended soak in hot air in order to decrease the temperature difference between the DUT and the probe card assembly. The soak could last several hours depending upon the circumstances. Soaks of this length can delay testing.

SUMMARY

An example test system includes a test head and a probe card assembly connected to the test head. The probe card assembly includes: a probe card having electrical contacts, a stiffener connected to the probe card to impart rigidity to the probe card, and a heater to heat to at least part of the probe card assembly. A prober is configured to move a device under test (DUT) into contact with the electrical contacts of the probe card assembly. The example test system may include one or more of the following features, either alone or in any appropriate combination.

The stiffener and the probe card may be made of materials having different coefficients of thermal expansion. The heater may be configured to impart enough heat to the stiffener so that expansion of the stiffener due to heating substantially matches expansion of the probe card due to heating. The heater may be mounted on the stiffener, inside the stiffener, and/or on the probe card. The heater may be, or include, a resistive heater.

The example test system may include a temperature sensor to sense a temperature of the probe card, and a controller to receive, from the temperature sensor, information representing the temperature of the probe card, and to output a control signal to control the heater based, in part, on the information in order to heat the stiffener. The control signal may be based also on one or more of the following factors: a modulus of the stiffener, a thickness of the stiffener, a shape of the stiffener, a coefficient of thermal expansion of the stiffener, a Poisson's ratio of the stiffener, a diameter of an interface of the prober, a modulus of the probe card, a thickness of the probe card, a Poisson's ratio of the probe card, or a temperature of the probe card.

The control signal may be, or include, a pulse-width modulated (PWM) control signal. A duty cycle of the PWM control signal may be based, at least in part, on the information representing the temperature of the probe card.

The temperature sensor may be, or include, one or more of a thermocouple, a thermistor, or a resistive temperature detector. The temperature sensor may be on the probe card and/or on the stiffener. The heater may be configured to heat the stiffener to limit deflection of the probe card to within a predefined amount.

The example test system may include a temperature sensor to sense a temperature of the probe card assembly during soaking of the probe card assembly in hot air; and a controller to receive, from the temperature sensor, information representing the temperature of the probe card assembly, and to output a control signal to control the heater based, in part, on the information so that temperature and heat flow associated with the probe card assembly remain substantially constant for a period of time.

An example method includes detecting a temperature of a probe card in a probe card assembly, where the probe card assembly includes: the probe card that has electrical contacts, a stiffener that is connected to the probe card to impart rigidity to the probe card, and a heater to heat to the stiffener. The example method also includes detecting a temperature of the stiffener; and controlling the heater to impart heat to the stiffener based on the temperature detected for the probe card and for the stiffener. The example method may include one or more of the following features, either alone or in any appropriate combination.

The heater may be configured to impart enough heat to the stiffener so that expansion of the stiffener due to heating substantially matches expansion of the probe card due to heating. The example method may include outputting a control signal to control the heater. The control signal may be based on the temperature detected and also on one or more of the following factors: a modulus of the stiffener, a thickness of the stiffener, a shape of the stiffener, a coefficient of thermal expansion of the stiffener, a Poisson's ratio of the stiffener, a diameter of an interface of the prober, a modulus of the probe card, a thickness of the probe card, a Poisson's ratio of the probe card, or a temperature of the probe card. Controlling the heater may include supplying a pulse-width modulated (PWM) control signal to the heater, where a duty cycle of the PWM control signal is based, at least in part, on the temperature detected.

An example method includes detecting a temperature of a probe card assembly, where the probe card assembly includes: a probe card having electrical contacts, a stiffener connected to the probe card to impart rigidity to the probe card, and a heater to heat to the stiffener. The example method also includes controlling the heater to impart heat to the probe card assembly based on the temperature detected during soak of the probe card assembly in hot air. The example method may include one or more of the following features, either alone or in any appropriate combination.

The heater may be controlled so that temperature and heat flow associated with the probe card assembly remain substantially constant for a period of time. Controlling the heater may include supplying a pulse-width modulated (PWM) control signal to the heater, where a duty cycle of the PWM control signal is based, at least in part, on the temperature detected.

Any two or more of the features described in this specification, including in this summary section, can be combined to form implementations not specifically described herein.

The systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features, objects, and advantages will be apparent from the description and drawings, and from the claims.

DESCRIPTION OF THE DRAWINGS

Like reference numerals in different figures indicate like elements.

DETAILED DESCRIPTION

Described herein are examples of automatic test equipment (ATE, also referred to as a test system or systems) that provides active thermal control over all or part of its device interface. As noted, a test cell that is part of the ATE may include a test head to route test signals to and from a device under test (DUT), such as a wafer. The test head includes an interface, called a probe card assembly, to make electrical and mechanical connection to the DUT. A prober moves the DUT into contact with the probe card assembly to implement testing. One or more heaters are included in the probe card assembly to actively control heating of the probe card assembly both during testing and during pre-testing hot air soak, as described herein.

Figure 1:
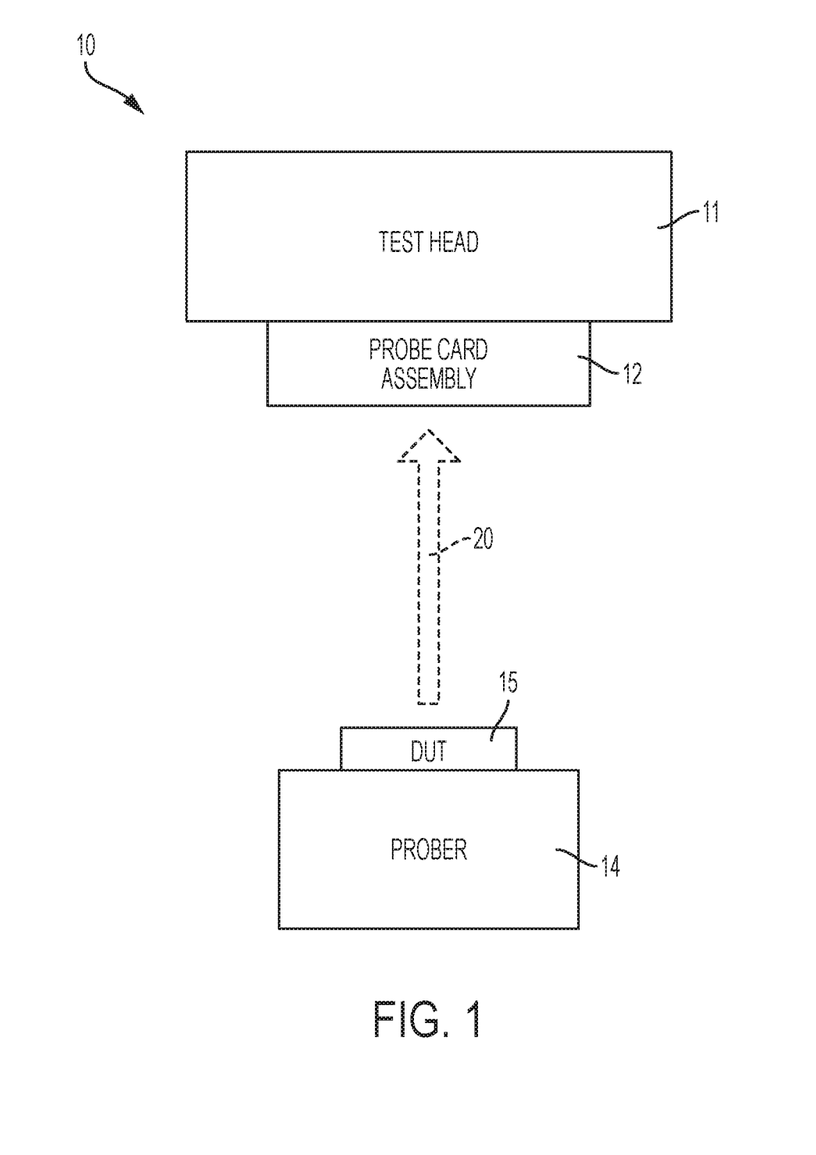
FIG. 1 is a block diagram of components of a test cell in an example test system.

FIG. 1 shows components of an example test system 10. The test system may include additional components to those shown, however, those shown include test head 11, probe card assembly 12, and prober 14. Test head 11 includes internal electronics (not shown) for sending signals to a DUT 15, and for receiving signals from the DUT. The signals sent to the DUT may be generated in the test head or elsewhere in the test system and may include, but are not limited to, test signals or other stimuli for application to the DUT. The signals output by, and received from, the DUT may include, but are not limited to, responses to signals output from the test head or signals that are independent of signals sent to the DUT.

Figure 2:
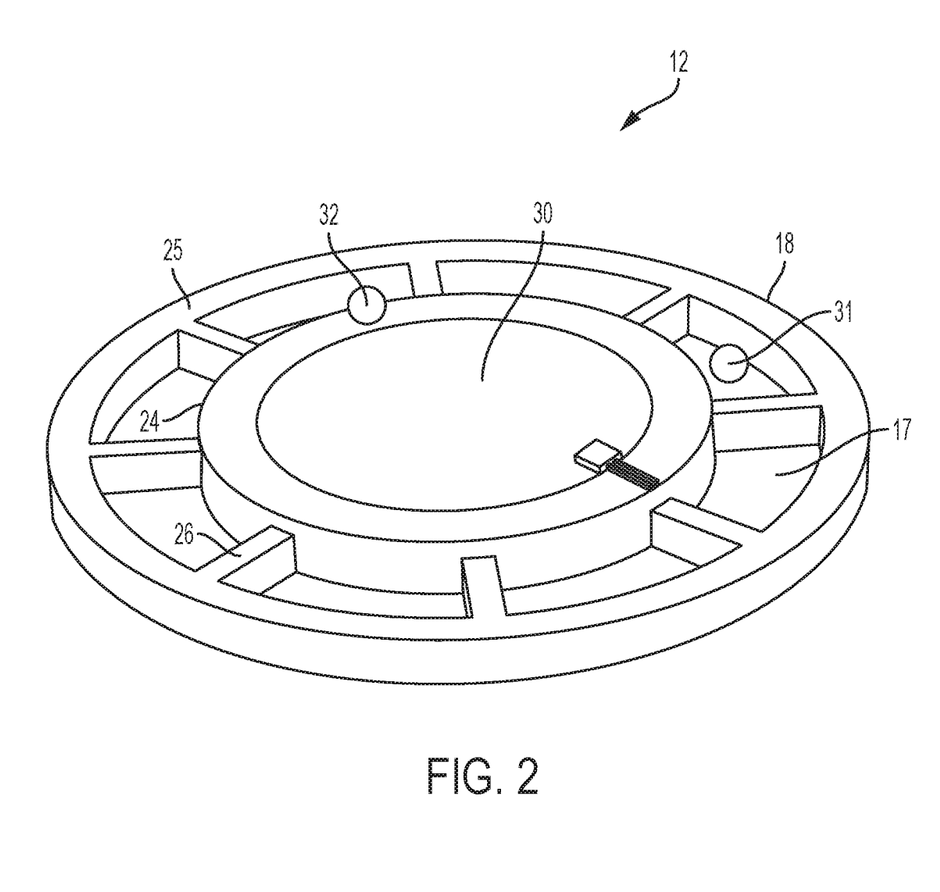
FIG. 2 is a top perspective view of components of a probe card assembly.
Figure 3:
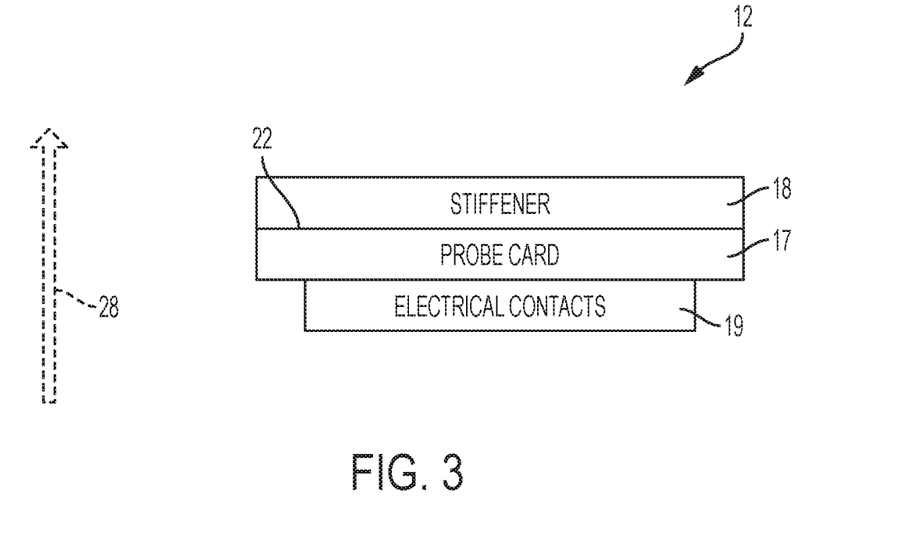
FIG. 3 is a side view of components of a probe card assembly.

The test head includes an interface to which the DUT connects. In this example, the interface includes probe card assembly 12. In the example of FIG. 1, DUT 15 is not yet connected to probe card assembly 12. Referring also to FIGS. 2 and 3, in this example, probe card assembly 12 includes a probe card 17 a stiffener 18, and electrical contacts 19 that connect to the DUT. Because of the angle at which the probe card assembly is presented in FIG. 2, the electrical contacts are not visible there.

DUT 15 mates to electrical contacts 19 through movement by prober 14 along the direction of arrow 20 (FIG. 1). This mating forms an electrical connection between the DUT and the probe card and the electrical pathways contained therein, and thus between the DUT and the test head and the electrical pathways contained therein. In this regard, probe card 17 may also include passive and/or active electrical components (not shown) and electrical pathways (not shown) for routing signals between the electrical contacts and the test head. Probe card 17 may be made of any appropriate printed circuit board substrate, such as FR-4. FR-4 is a composite material composed of woven fiberglass cloth with an epoxy resin binder. Other materials, such as copper, may be used in addition to, or instead of, FR-4.

Stiffener 18 is connected to probe card 17 on a surface 22 (FIG. 3) that does not include electrical contacts 19 (e.g., on a surface facing test head 11). Stiffener 18 is connected to probe card 17 so as to impart rigidity, or increased rigidity, to the probe card. As a result of the increased rigidity provided by stiffener 18, the probe card is less susceptible to bending in response to an applied force, such as forces produced when the prober mates the DUT to the probe card assembly.

Figure 4:
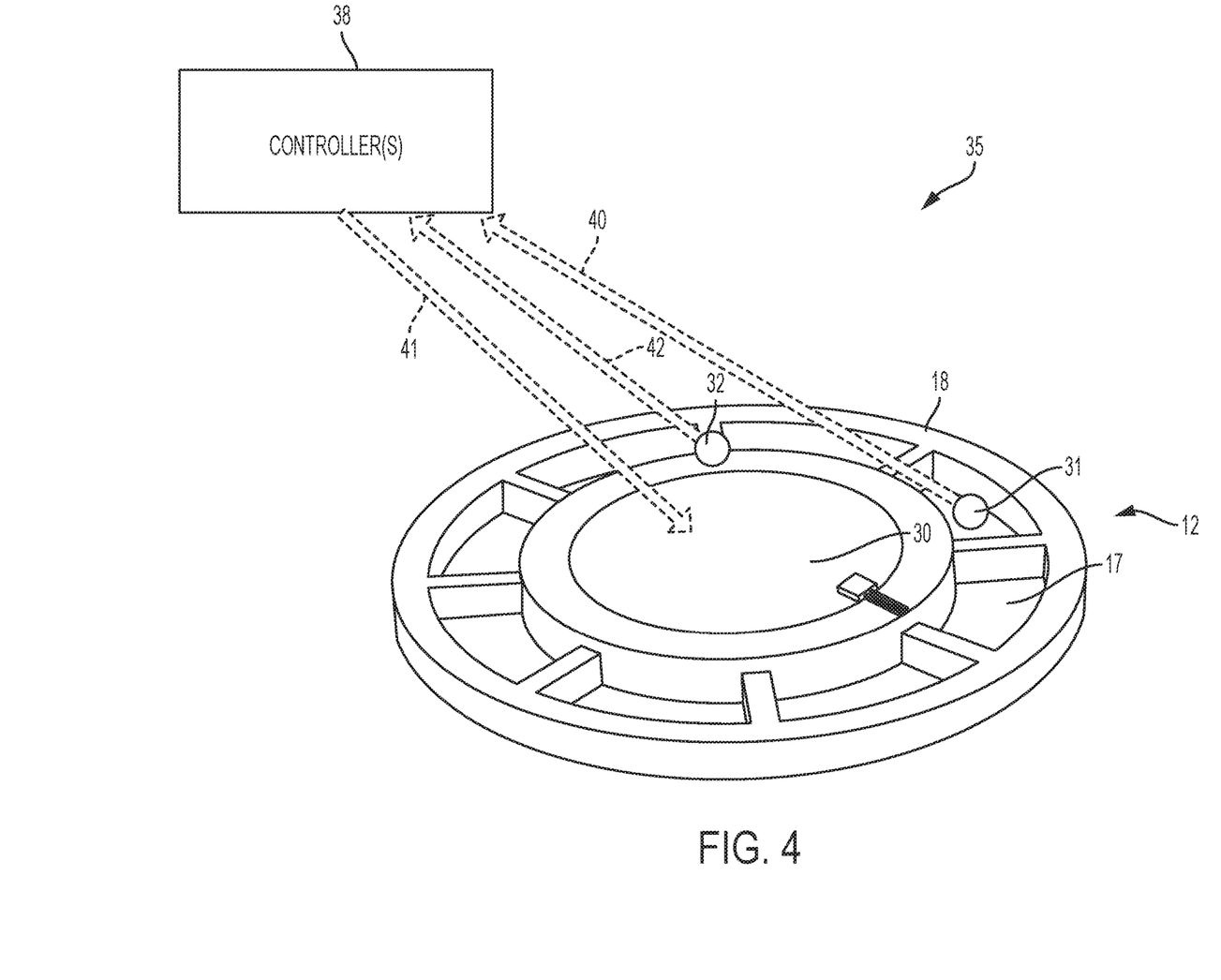
FIG. 4 is a diagram of components of a control system, which is part of the example test system, to implement thermal control over the probe card assembly.

Stiffener 18 may have any appropriate shape, and is not limited to the shape shown in FIGS. 2 and 4, which includes two concentric circles 24, 25 connected by spokes 26. Stiffener 18 may be made of any appropriate material or materials including, but not limited to, aluminum (AL), stainless steel, and/or alloy 42 (a controlled expansion alloy, comprised of 42% Nickel, with the remainder including iron). In some implementations, the stiffener may be a single contiguous structure as shown. In some implementations, the stiffener may be made of separate, connected parts, including two or more layers stacked in the vertical direction 28 (FIG. 3). In some implementations, the stiffener may include multiple structures that are unconnected and are at different locations on the probe card.

As shown in FIGS. 2 (and 4), example probe card assembly 12 also includes a heater 30 to apply heat to the probe card assembly, and temperature sensors 31 and 32 to sense the temperature of the probe card and the stiffener, respectively. The heater and the temperature sensors are part of a control system that actively controls the temperature of the probe card assembly during soak and during testing. An example of the control system is described with respect to FIG. 4.

During testing, the DUT may be hotter than the probe card. In some cases, however, the probe card may be hotter than the DUT. In any case, when there is a difference in temperature between the DUT and the probe card, contact between the probe card and the DUT can result in movement (e.g., bending) of the probe card. This movement is typically towards the DUT and is therefore referred to as deflection. More specifically, the probe card, which is a bottom-most layer, heats-up causing it to expand. The stiffener, however, remains relatively cool and does not expand as much as the probe card. The difference in expansion causes the probe card to deflect concave-up, causing the probe card to move toward the DUT. In some cases, deflection may be on the order of microns.

The desired probe card assembly temperature is the predicted or determined steady state temperature when the DUT is in contact with the probe card assembly. The steady state temperature of the probe card assembly is often lower than the DUT temperature. Thus, there is thermal resistance between the DUT and the probe card assembly. So, there is a temperature gradient through the assembly in its Z-axis. There is also a temperature gradient radially as you move farther away from the area of the probe head making contact with the DUT.

The stiffener and the probe card may have different coefficients of thermal expansion and, therefore, application of heat to the probe card assembly can cause the probe card and the stiffener to expand different amounts. As a result, the stiffener may be less able to alleviate thermally-induced deflection.

Accordingly, the techniques described herein employ one or more temperature sensors to detect the temperature of the probe card and/or the stiffener, and one or more heaters to apply heat to the probe card and/or stiffener. As described herein, heat may be applied, as needed, in order to increase the temperature of the probe card assembly toward the temperature of the DUT and to actively control the temperature of the stiffener so that its thermal expansion matches the thermal expansion of the probe card. In an example, a technique described herein includes detecting a temperature of the probe card during probing (e.g., during test), and controlling the heater during probing to impart heat to the stiffener based, at least in part, on the temperature. In another example, a technique described herein includes detecting a temperature of a probe card assembly during soak of the probe card assembly in hot air or other gas, and controlling the heater during soak to impart heat to the probe card assembly based, at least in part, on a temperature of the probe card assembly detected during soak.

In some implementations, the test cell includes different temperature sensor(s) to detect the temperature of the probe card assembly, and different temperature sensor(s) to detect the temperature of the stiffener. Although multiple temperature sensors may be used in each case, a single temperature sensor is described herein to perform each function. In the examples shown in FIGS. 2 and 4, a first temperature sensor 31 is configured to sense and to monitor over time the temperature of probe card 17. In some examples, temperature sensor 31 is located on, connected to, or built into probe card 17. In other examples, temperature sensor 31 may be located on, connected to, or built into other components of probe card assembly 12, such as stiffener 18, or elsewhere, such as test head 11. In the examples of FIGS. 2 and 4, a second temperature sensor 32 is configured to sense and to monitor over time the temperature of stiffener 18. In some examples, temperature sensor 32 is located on, connected to, or built into stiffener 18. In other examples, temperature sensor 32 may be located on, connected to, or built into other components of probe card assembly 12, such as probe card 17, or elsewhere, such as test head 11.

In some implementations, each temperature sensor 31, 32 includes one or more of the following: a thermocouple, a thermistor, or a resistive temperature detector (RTD). Other types of temperature sensors may also be used alone or in combination with one or more of these types of temperature sensors. Each temperature sensor provides feedback to a control loop which, as described below, includes one or more control devices (e.g., a controller, processor, or the like) to control operation of heater(s) in order to control the temperature of all or at least part of the probe card assembly. Description of an example control system is provided with respect to FIG. 4.

As noted, there may be one or more heaters used to heat the probe card assembly. Although multiple heaters may be used in each case, a single heater 30 is shown in FIGS. 2 and 4 to heat the stiffener and to heat the probe card. The heater may be a resistive heating device that is controllable through application of a pulse width modulated (PWM) control signal from a control device. Other types of heaters may also be used. The heater may be located on, connected to, or built into stiffener 18. Alternatively, the heater may be located on, connected to, or built into probe card 17.

FIG. 4 shows components of an example control system 35 for actively controlling the temperature of all or part of the probe card assembly. Example control system includes one or more controllers 38 (referred to as controller 38), which may include, or be, any appropriate type of processing device, such as those described herein. Controller 38 communicates wirelessly or over wires to the temperature sensors and heater in probe card assembly 12. For example, the communication may be through electrical pathways in the test head, in the prober, or in both. The control system may also include other components, which are not depicted in FIG. 4.

During hot air soak, there may be an initial deflection of the probe card (in some cases, by about 50 to 500 microns, although other amounts are possible). Time is required to allow this initial deflection to occur. The magnitude of this initial deflection is less of a concern than is the time it takes to reach a substantial steady state condition. In this context, steady state includes a condition in which temperature and heat flow associated with the probe card assembly remains substantially constant for at least a specified period of time. Incorporating a heater into the probe card assembly (e.g., into the stiffener) can reduce the soak time needed to reach the steady state condition.

After the probe card assembly has reached the steady state condition, testing of actual devices (DUTs) may be performed. At this point, deflection of the probe card may occur, as described herein. That is, the prober drives the DUT into contact with the probe card. The positional changes of the DUT and the repeated making and breaking of the conductive heat transfer path between the DUT and the probe card may cause thermally induced movement (e.g., deflection). A heater may be used in an active sense to counteract the temperature changes that occur while probing and, as a result, reduce the amount of deflection that occurs to within acceptable limits.

As described herein, one or multiple temperature sensing devices (in this example, temperature sensor 31) may be on the probe card. The temperature sensed by temperature sensor 31 is an input value for a controller 38. There also may be one or multiple temperature sensing devices (in this example, temperature sensor 32) on the probe card stiffener to close the control loop. Thus, the temperature sensed by temperature sensor 32 is the parameter that is controlled by controller 38.

In an example operation, during soak, controller 38 receives, from temperature sensor 31, information 40 representing the temperature of the probe card. Based, at least in part, on that information representing the temperature of the probe card, the controller outputs a control signal 41 to control the heater in order to apply heat to the stiffener and the probe card assembly in general. Control may include turning the heater on or off, continuously or intermittently, in order to reach a specified temperature. Control over the temperature is based on a number of factors including, but not limited to, a modulus of the stiffener, a thickness of the stiffener, a shape of the stiffener, a coefficient of thermal expansion of the stiffener, a Poisson's ratio of the stiffener, a diameter of an interface of the prober, a modulus of the probe card, a thickness of the probe card, a Poisson's ratio of the probe card, and/or the temperature of the probe card sensed by sensor 31. Controller 38 therefore takes these factors into account when generating the control signal (e.g., a PWM signal) to control the heater.

Temperature sensor 31 senses the temperature of the probe card assembly during soak, and controls the heater 30 to apply heat, as needed, to the stiffener, and thus, the probe card assembly. For example, the temperature may be sensed continually or intermittently, and information about the temperature may be relayed to the controller. In response, the controller may output a control signal to control the heater, as appropriate. In some implementations, heat is applied via the heater and hot-air soak until the temperature of the probe card assembly reaches a specified temperature and remains at that temperature for a specified period of time. That is, temperature sensors 31, 32 output information representing the temperature of the probe card assembly to the controller and, in response, the controller controls the heater until the probe card assembly reaches a steady state temperature (in the presence of the air soak). By heating the probe card assembly using a heater during soak, a target temperature of the probe card assembly can be reached more rapidly than the target temperature could be reached absent use of a heater. As a result, soak time, and thus overall test time, can be reduced. For example, in some implementations, soak time can be reduced from hours to minutes.

After the probe card assembly reaches the specified temperature, testing may be performed, as explained herein. As part of the testing process, the prober brings the DUT into contact with the probe card assembly, thereby enabling signals to be exchanged between the two. During testing, temperature sensor 31 on probe card 17 senses the temperature of the probe card. Information 40 representing this temperature is transmitted to controller 38. Controller 38 outputs a control signal 41 to heater 30. Heater 30 is controlled to impart enough heat to stiffener 18 so that expansion of the stiffener due to heating substantially matches expansion of probe card 17 due to heating. The heating of the probe card assembly may result from contact with the DUT or other thermal sources in the test system.

In some implementations, imparting enough heat to stiffener 18 so that expansion of the stiffener due to heating substantially matches expansion of probe card 17 means that the temperature of the stiffener is made to match, or to substantially match, the target temperature of the probe card. However, as may be the case, the coefficient of thermal expansion of the probe card may be different than the coefficient of thermal expansion of the stiffener. In cases like these, the temperature of the stiffener may not be controlled to match the temperature of the probe card. Instead, the heater is controlled based on the temperature detected at the probe card, but also based on other factors that affect expansion of the probe card and the stiffener in response to heat. These other factors may include, but are not limited to, the following: a modulus of the stiffener, a thickness of the stiffener, a shape of the stiffener, a coefficient of thermal expansion of the stiffener, a Poisson's ratio of the stiffener, a diameter of an interface of the prober, a modulus of the probe card, a thickness of the probe card, and/or a Poisson's ratio of the probe card. The controller 38 therefore may take these (and other appropriate) factors into account when generating the control signal (e.g., a PWM signal) to control the heater during probing/test.

During probing/test, temperature sensor 32 senses the temperature of the stiffener. Information 42 representing this temperature is transmitted to controller 38. Controller 38 adjusts control signal 41 to heater 30 based on information 42 so that the temperature of stiffener 18 approaches a target temperature that is based on the information 40 about the temperature of probe card 17. Because the probe card and the stiffener may have different coefficients of thermal expansion, the target temperature may not be the exact temperature of the probe card, but may be based on that temperature and one or more of the other factors listed herein.

In some implementations, the controller may implement any appropriate control processes to generate the control signals. For example, the controller may implement a proportional-integral-derivative controller (PID). A PID controller continuously determines an error value as a difference between a measured variable (in this case, the temperature of the probe card) and a desired value (in this case, a temperature target for the stiffener). The PID controller attempts to minimize the error over time by adjusting the power supplied to the heater to a new value determined by a weighted sum. In other implementations, other types of control may be implemented.

Testing, including heating control, performed by the example test system described herein may be implemented using hardware or a combination of hardware and software. For example, a test system like the one described herein may include various controllers and/or processing devices located at various points in the system to control operation of the automated elements. A central computer may coordinate operation among the various controllers or processing devices. The central computer, controllers, and processing devices may execute various software routines to effect control and coordination of the various automated elements.

The techniques described herein may be performed by automatic test equipment or any other appropriate computing device. The techniques can be controlled, at least in part, using one or more computer program products, e.g., one or more computer program tangibly embodied in one or more information carriers, such as one or more non-transitory machine-readable media, for execution by, or to control the operation of, one or more controllers or control devices, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a wired or wireless connection that includes intervening components but that nevertheless allows electrical signals to flow between connected components. Any "connection" involving electrical circuitry mentioned herein, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A test system comprising:
   a test head;
   a probe card assembly connected to the test head, the probe card assembly comprising:
      a probe card having electrical contacts;
      a stiffener connected to the probe card to impart rigidity to the probe card;
      a heater to heat at least the stiffener, the heater being directly above the probe card and on the probe card;
      a first temperature sensor on the probe card to detect a temperature of the probe card; and
      a second temperature sensor on the stiffener to detect a temperature of the stiffener;
   a prober to move a device under test into contact with the electrical contacts of the probe card; and
   a controller configured to control the heater to control the temperature of the stiffener using a control signal generated based on the temperature of the probe card, a size of the prober, and a shape of the stiffener;
   wherein the stiffener and the probe card have different coefficients of thermal expansion.

2. The test system of claim 1, wherein the heater is configured to impart enough heat to the stiffener so that expansion of the stiffener due to heating substantially matches expansion of the probe card due to heating.

3. The test system of claim 1, wherein the heater is in contact with the stiffener.

4. The test system of claim 1, wherein the heater is mounted inside the stiffener.

5. The test system of claim 1, wherein the heater comprises a resistive heater.

6. The test system of claim 1, wherein the controller is configured to receive, from the first temperature sensor, information representing the temperature of the probe card, and to output the control signal to control the heater based, in part, on the information in order to heat the stiffener.

7. The test system of claim 6, wherein the control signal is based also on one or more of the following factors: a modulus of the stiffener, a thickness of the stiffener, a coefficient of thermal expansion of the stiffener, a Poisson's ratio of the stiffener, the size comprising a diameter of an interface of the prober, a modulus of the probe card, a thickness of the probe card, or a Poisson's ratio of the probe card.

8. The test system of claim 6, wherein the control signal comprises a pulse-width modulated (PWM) control signal.

9. The test system of claim 8, wherein a duty cycle of the PWM control signal is based, at least in part, on the information.

10. The test system of claim 6, wherein the first temperature sensor comprises one of a thermocouple, a thermistor, or a resistive temperature detector.

11. The test system of claim 1, wherein the heater is configured to heat the stiffener to limit deflection of the probe card to within a predefined amount.

12. The test system of claim 1, wherein the controller is configured to receive, from the first temperature sensor, information representing the temperature of the probe card assembly, and to output the control signal to control the heater based, in part, on the information so that temperature and heat flow associated with the probe card assembly remain substantially constant for a period of time.

13. A method comprising:
    detecting a temperature of a probe card in a probe card assembly using a first temperature sensor on the probe card, the probe card assembly comprising:
       the probe card, the probe card having electrical contacts,
       a stiffener that is connected to the probe card to impart rigidity to the probe card, and
       a heater to heat at least the stiffener, the heater being directly above the probe card and on the probe card;
    detecting a temperature of the stiffener using a second temperature sensor on the stiffener; and
    controlling the heater to impart heat to the stiffener using a control signal generated based on the temperature of the probe card and based on a size of a prober used to move a device under test into contact with the electrical contacts of the probe card, and a shape of the stiffener;
    wherein the stiffener and the probe card have different coefficients of thermal expansion.

14. The method of claim 13, wherein the heater is configured to impart enough heat to the stiffener so that expansion of the stiffener due to heating substantially matches expansion of the probe card due to heating.

15. The method of claim 13, wherein controlling the heater is based also on one or more of the following factors: a modulus of the stiffener, a thickness of the stiffener, a coefficient of thermal expansion of the stiffener, a Poisson's ratio of the stiffener, the size comprising a diameter of an interface of the prober, a modulus of the probe card, a thickness of the probe card, or a Poisson's ratio of the probe card.

16. The method of claim 13, wherein the control signal comprises a pulse-width modulated (PWM) control signal to the heater, and wherein a duty cycle of the PWM control signal is based, at least in part, on the temperature of the probe card or the temperature of the stiffener.

17. A method comprising:
    detecting a temperature of a probe card assembly using a first temperature sensor and a second temperature sensor, the probe card assembly comprising:
       a probe card having electrical contacts, the first temperature sensor being on the probe card,
       a stiffener connected to the probe card to impart rigidity to the probe card, the second temperature sensor being on the stiffener, and
       a heater to heat at least the stiffener, the heater being above the probe card and on the probe card, and the heater being directly above the electrical contacts; and controlling the heater to impart heat to the stiffener based on the temperature of the probe card during soak of the probe card assembly in hot air until a temperature of the probe card assembly reaches a specified temperature and remains at the specified temperature for a specified period of time, and controlling the heater using a control signal generated based also on size of a prober used to move a device under test into contact with the electrical contacts of the probe card, and a shape of the stiffener;

wherein the stiffener and the probe card have different coefficients of thermal expansion.

18. The method of claim 17, wherein the control signal comprises a pulse-width modulated (PWM) control signal to the heater, and wherein a duty cycle of the PWM control signal is based, at least in part, on the temperature of the probe card assembly.

19. The method of claim 17, wherein controlling the heater is based also on one or more of the following factors: a modulus of the stiffener, a thickness of the stiffener, a coefficient of thermal expansion of the stiffener, a Poisson's ratio of the stiffener, a modulus of the probe card, a thickness of the probe card, or a Poisson's ratio of the probe card.

* * * * *